(12) United States Patent
Ochi

(10) Patent No.: US 8,456,196 B2
(45) Date of Patent: Jun. 4, 2013

(54) HIGH-SPEED COMPARATOR

(75) Inventor: Sam Seiichiro Ochi, Saratoga, CA (US)

(73) Assignee: Microsemi Corporation, Aliso Viejo, CA (US)

( * ) Notice: Subject to any disclaimer, the term of this patent is extended or adjusted under 35 U.S.C. 154(b) by 228 days.

(21) Appl. No.: 13/012,645

(22) Filed: Jan. 24, 2011

(65) Prior Publication Data
US 2011/0204923 A1   Aug. 25, 2011

Related U.S. Application Data

(60) Provisional application No. 61/297,570, filed on Jan. 22, 2010.

(51) Int. Cl.
*H03F 3/45*   (2006.01)

(52) U.S. Cl.
USPC ............................................. 327/52; 327/50

(58) Field of Classification Search
USPC ................................. 327/50, 51, 52
See application file for complete search history.

(56) References Cited

U.S. PATENT DOCUMENTS

| | | | |
|---|---|---|---|
| 6,172,535 B1 * | 1/2001 | Hopkins | 327/66 |
| 6,894,564 B1 * | 5/2005 | Gilbert | 330/254 |
| 7,911,237 B2 * | 3/2011 | Maone | 327/77 |

* cited by examiner

*Primary Examiner* — Hai L Nguyen
(74) *Attorney, Agent, or Firm* — Holland & Hart LLP

(57) ABSTRACT

Methods, systems, and devices are described for providing voltage comparison adapted to operate at high-speeds and over a relatively large range of supply voltages.

19 Claims, 6 Drawing Sheets

HIGH-SPEED COMPARATOR

CROSS-REFERENCE TO RELATED APPLICATIONS

This application claims priority to U.S. Provisional Patent Application No. 61/297,570, entitled "High-Speed Comparator," filed on Jan. 22, 2010, the entire disclosure of which is incorporated herein by reference.

FIELD

The present invention relates to voltage comparators in general and, in particular, to high-speed comparator circuits.

BACKGROUND

Many electronics applications use high-speed comparators to rapidly convert changing (e.g., analog) input voltage signals into switched (e.g., digital) output voltage signals, A number of techniques are known in the art for improving the performance of high-speed comparators. Some implementations seek to increase the speed of the comparator, for example, by decreasing the gain of its gain stages. Other implementations seek to increase the range of supply voltages over which the comparator may effectively operate. Often, however, these implementation goals are at odds and may limit the performance of the comparator.

As such, it may be desirable to provide a high-speed comparator that operates both at high speeds and at a large range of supply voltages.

BRIEF DESCRIPTION OF THE DRAWINGS

A further understanding of the nature and advantages of the present invention may be realized by reference to the following drawings. In the appended figures, similar components or features may have, the same reference label. Further, various components of the same type may be distinguished by following the reference label by a second label (e.g., a lower-case letter) that distinguishes among the similar components. If only the first reference label is used in the specification, the description is applicable to any one of the similar components having the same first reference label irrespective of the second reference label.

DETAILED DESCRIPTION OF THE INVENTION

Among other things, systems, devices, and methods are described for providing voltage comparison adapted to operate at high-speeds and over a relatively large range of supply voltages.

Figure 1:
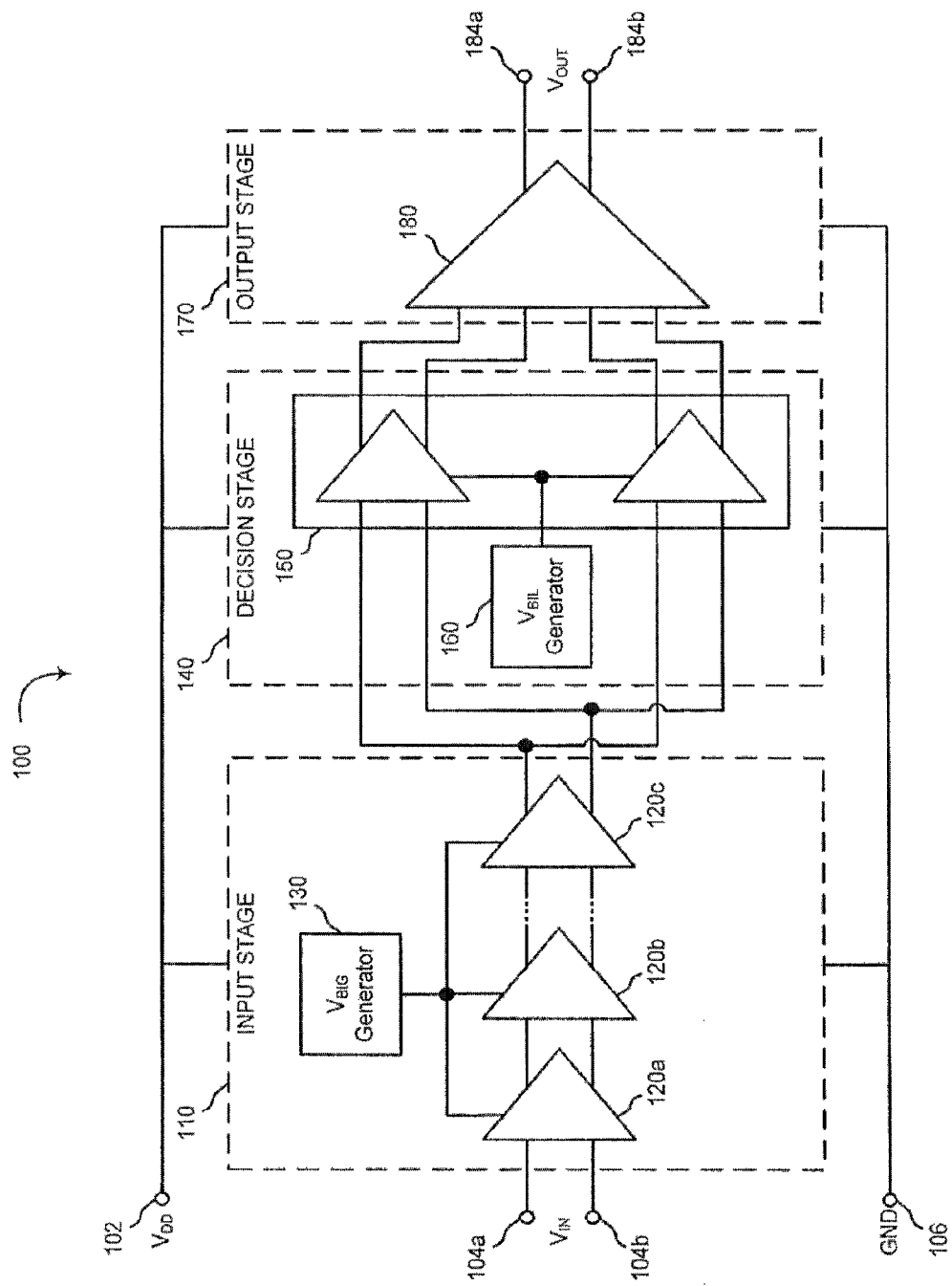
FIG. 1 shows a simplified block diagram of an illustrative high-speed comparator.

FIG. 1 shows a simplified block diagram of an illustrative high-speed comparator 100. Embodiments of the high-speed comparator 100 receive an input voltage (e.g., a small signal analog voltage) at input terminals 104 and generate an output voltage (e.g., a CMOS-compatible voltage) at output terminals 184. In some embodiments, as illustrated, the high-speed comparator 100 is coupled with a supply voltage rail 102 at $V_{DD}$ and a ground rail 106 at GND. The input voltage signal may typically be received differentially, and the output voltage signal may typically be generated differentially.

The high-speed comparator 100 includes an input stage 110, a decision stage 140, and an output stage 170. The input stage 110 receives the input voltage signal from input terminals 104 at one or more gain stage modules 120. Each of the gain stage modules 120 adds gain to the input voltage signal. Embodiments of the gain stage modules 120 are driven by a gain bias voltage $V_{BIG}$. The gain bias voltage is generated by a $V_{BIG}$ generator module 130, as described in more detail below. As illustrated, the gain stage modules 120 may be cascaded to provide sufficient gain to drive the decision stage 140.

The decision stage 140 includes a level shifter module 150 and a $V_{BIL}$ generator module 160. The level shifter module 150 receives the amplified version of the input voltage signal from the input stage 110 and generates a level shifted voltage signal. In some embodiments, the level shifted voltage signal maintains substantially the same relative voltage changes as in the amplified voltage signal, but shifted to a different absolute voltage level. In certain embodiments, the level shifted voltage signal includes both a positive level shifted voltage signal and a negative level shifted voltage signal. The output of the decision stage 140 (e.g., the level shifted voltage signal) is adapted to drive the output stage 170 of the high-speed comparator 100.

In some embodiments, the output stage 170 includes an output amplifier module 180. The level shifted voltage signal is received by the output amplifier module 180 and converted into a desired output voltage signal. In certain embodiments, the output amplifier module 180 is configured to generate an active CMOS level output voltage signal as a function of the signal received from the decision stage 140.

In one embodiment, the high speed comparator is used to implement each "bit" of a 3-bit analog-to-digital ("A-to-D") converter. An analog voltage signal with a peak-to-peak voltage of one volt is divided into $2^3=8$ levels, each being 0.125 volts. The input stage 110 receives a small signal analog voltage (e.g., a 0.125 volt change) at its input terminals 104. Gain is applied to the signal through 3 cascaded gain stage modules 120, each providing a minimum of two-times to a maximum of approximately four-times gain. For purposes for this discussion, assume a constant gain of two. As such the 0.125V signal is amplified into a 1V signal at the output of the input stage 110. The 1V signal is received by a level shifter module 150 in the decision stage, which shifts the 1V level to generate a positive drive signal and a negative drive signal. These drive signals are then used to drive an output amplifier module 180 in the output stage 170. The output amplifier module 180 uses the drive signals to provide approximately three-times large-signal gain to the amplified 1V signal received at the decision stage 140. This generates a large-signal 3V output voltage signal, which is sufficient to drive a desired large signal device (e.g., a CMOS device). The large-signal device is then effectively switched by the signal, registering a large-signal "digital" indication of the small-signal change in analog input.

Figure 2A:
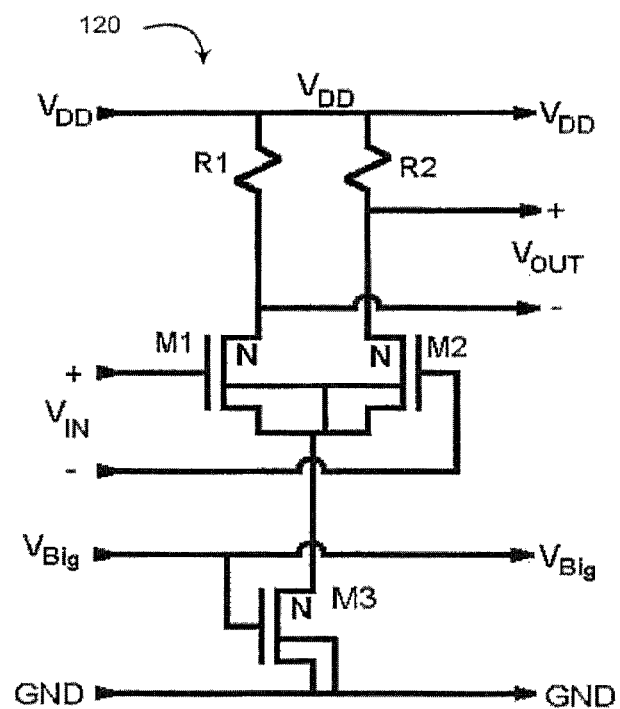
FIG. 2A shows a schematic diagram of an embodiment of a gain stage module, according to various embodiments of the invention.
Figure 3A:
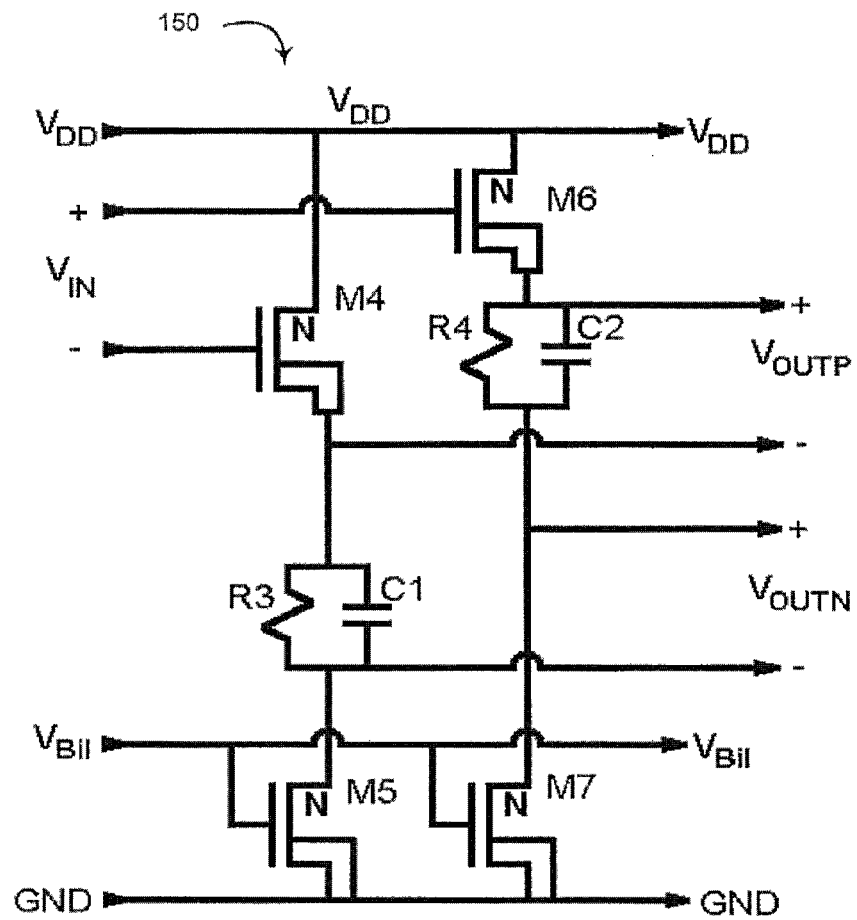
FIG. 3A shows a schematic diagram of an embodiment of a level shifter module, according to various embodiments of the invention.
Figure 3B:
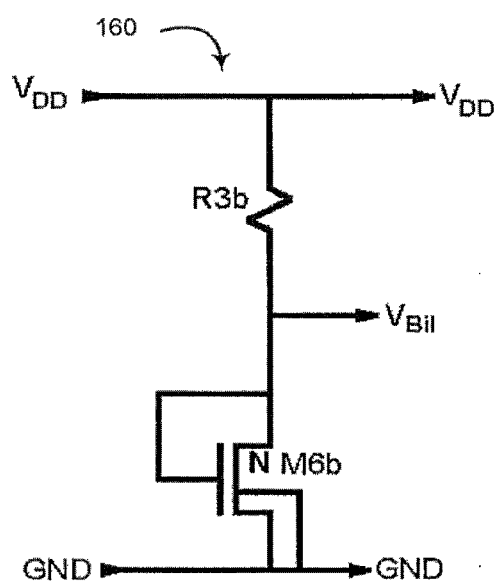
FIG. 3B shows a schematic diagram of an embodiment of a $V_{BIL}$ generator module, according to various embodiments of the invention.
Figure 4:
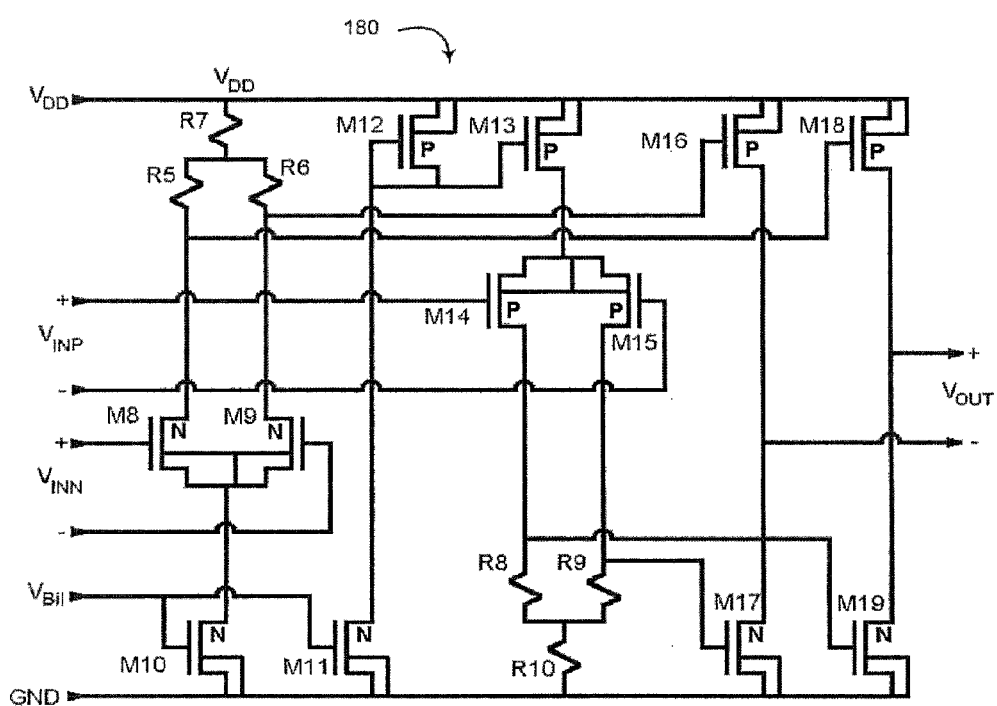
FIG. 4 shows a schematic diagram of an embodiment of an output amplifier module for generating a large-signal output voltage for a high-speed comparator, according to various embodiments of the invention.

Embodiments of the input stage 110, the decision stage 140, and the output stage 170 are shown in FIGS. 2-4, respectively. FIG. 2A shows a schematic diagram of an embodiment of a gain stage module 120 (e.g., like the gain stage module 120 of FIG. 1), according to various embodiments of the invention. The gain stage module 120 includes a differential pair having two metal-oxide semiconductor ("MOS") devices (M1 and M2), each in communication with a load (R1 and R2, respectively). The current through M1 and M2 is provided by a tail current source M3, and the gain stage module 120 is coupled between voltage rail $V_{DD}$ and ground rail GND.

An input voltage $V_{IN}$ (e.g., a small signal analog voltage) is received differentially as the gate voltages of M1 and M2. Elements of the gain stage module 120 provide gain to the input voltage signal and generate an output voltage signal $V_{OUT}$. For example, sizing the MOS elements M1 and M2 to form a perfectly symmetrical differential amplifier may provide zero common mode gain, in which case the output voltage signal $V_{OUT}$ may be calculated simply as the input voltage signal $V_{IN}$ times the differential gain of the gain stage module 120.

It is generally known in the art that increasing the gain of a comparator may limit its speed. Furthermore, it may be desirable to design the comparator to operate with M1 and M2 in their saturated regions. For example, when an MOS device (e.g., M1 or M2) falls out of saturation, large channel capacitances may couple with the drain, which may cause poor speed performance of the MOS device. For at least these reasons, loads R1 and R2 may be selected to limit the gain of the comparator and to keep MOS devices M1 and M2 operating in saturation.

Many high-speed comparator designs use active devices operating in their linear regions to implement loads RL and R2. For example, P-channel diode-connected MOS devices operating in their linear regions may effectively manifest gate-voltage-variable resistance characteristics. As $V_{GS}$ of the MOS load device decreases, its effective resistance increases, thereby causing a smaller change in its drain-to-gate potential over a larger range of $V_{DD}$. This technique may be used to maintain M1 and M2 in saturation even as $V_{DD}$ changes. However, it will be appreciated that using diode-connected MOS devices to replace R1 and R2 may reduce the speed performance of the comparator due to the MOS device's gate to source coupling directly to $V_{OUT}$.

It will be appreciated, however, that as $V_{GS}$ of the MOS load device approaches its saturation voltage (i.e., as the device leaves the linear region), its effective resistance may asymptotically approach infinity, causing the drain current through the MOS load device to approach zero. Thus, the acceptable $V_{DD}$ range for the gain stage module 120 may be limited. Further, as discussed above, operation of the MOS load devices in their linear regions may result in additional undesirable performance characteristics (e.g., the channel capacitance of the MOS load device may reduce the speed of the comparator).

In some high-speed comparator designs, rather than using MOS devices for loads R1 and R2, the loads are implemented using resistors. One limitation of using resistors, however, is that the acceptable range of $V_{DD}$ values for the gain stage module 120 may be even more limited than when using MOS devices. For example, say $V_{DD}$ is 3.3V, the gate voltage of M1 is 1V, the threshold voltage for M1 is 1V, and the voltage drop across R1 is 1V. These values result in a drain-to-gate potential for M1 of 1.3V (i.e., $V_{DD}-V_{R1}-V_{G(M1)}=3.3-1-1=1.3V$). If $V_{DD}$ drops to 2.9V, the drain-to-gate potential for M1 decreases to 0.9V (i.e., $V_{DD}-V_{R1}-V_{G(M1)}=2.9-1-1=0.9V$), which is lower than the threshold voltage of M1. As such, using resistors, a relatively small change in $V_{DD}$ may take M1 out of saturation.

Notably, in the above example in which resistors were used to implement R1 and R2, it was assumed that M3 provided a constant tail current for the circuit. In fact, in many typical implementations in the art, components are provided specifically in an attempt to keep the current through M3 substantially constant in the context of varying circuit conditions (e.g., changing temperatures). However, with a constant current through the load, a change in $V_{DD}$ may cause a proportional change in the voltage drop across load, as discussed above. This, in turn, may limit the effective $V_{DD}$ range of the gain stage module 120.

Embodiments of the gain stage module 120 address this issue by actively varying the tail current sourced by M3, thereby varying the current through the load and offsetting changes in the voltage drop across the load. Active regulation of the current through the load may be accomplished by actively regulating the gate voltage of M3 (e.g., using the gate voltage level like a valve to affect the flow of current through the current source). Embodiments of the gain stage module 120 couple the gate voltage of M3 with a gain bias voltage $V_{BIG}$.

Figure 2B:
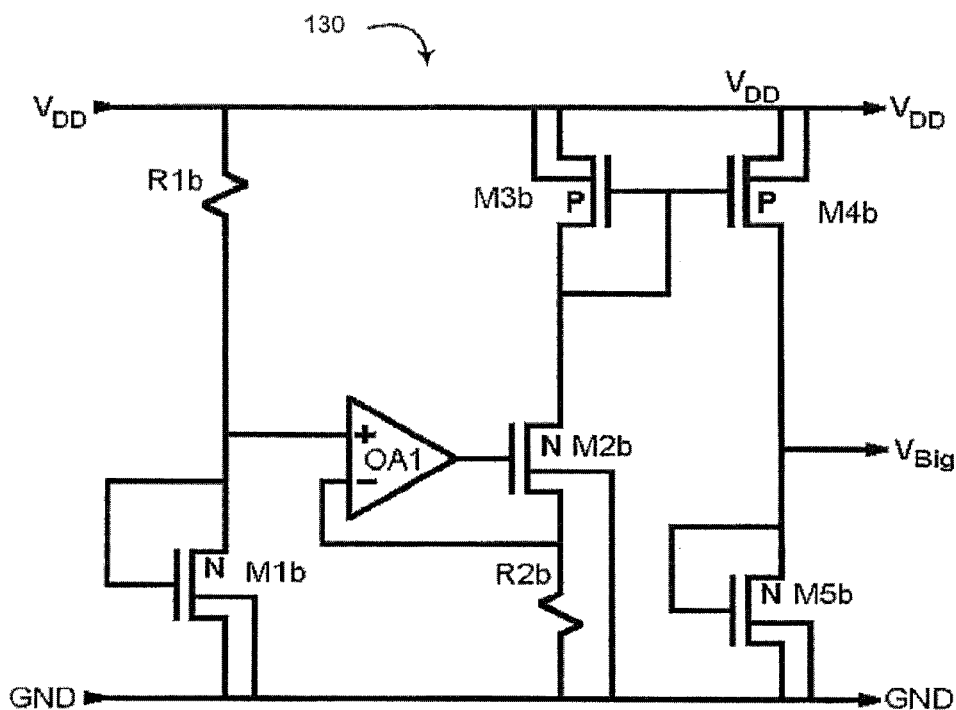
FIG. 2B shows a schematic diagram of an embodiment of a $V_{BIG}$ generator module for generating a gain bias voltage, according to various embodiments of the invention.

FIG. 2B shows a schematic diagram of an embodiment of a $V_{BIG}$ generator module 130 (e.g., like the $V_{BIG}$ generator module 130 of FIG. 1) for generating a gain bias voltage, according to various embodiments of the invention. The $V_{BIG}$ generator module 130 includes an active device M1b and a load R1b. In some embodiments, active device M1b is a large (e.g., large width-to-length ("W/L") ratio) diode-connected MOS device, and load R1b is a large load (e.g., a large resistor). It is known that the drain current of an MOS device can be calculated by the simplified expression $$I_D = \frac{W}{L}\beta(V_{GS} - V_T)^2,$$

where $V_{GS}$ is the gate-to-source potential of the MOS device and $V_T$ is the threshold voltage of the MOS device.

The equation may be solved for $V_{GS}$ as $$V_{GS} = \sqrt{\frac{I_D}{\frac{W}{L}\beta}} + V_T.$$

It can be seen from this equation that $V_{GS}$ approaches $V_T$ either as $I_D$ gets very small or as W/L gets very large. As such, using a large M1b (i.e., having a large W/L) and/or a large R1b (i.e., decreasing $I_D$) may cause M1B to operate very near its native threshold voltage. For example, for a given current, $V_{GS}$ approaches $V_T$ (e.g., for $I_D=>0$, $V_{GS}=>\sim V_T$).

The gate voltage of M1b is coupled with the non-inverting input of op-amp OA1, which drives the gate of another MOS device M2b. The inverting input of OA1 is coupled with the connection between M2b and another resistor R2b. In this configuration, OA1 essentially reproduces the gate-to-source potential of M1b across R2b in feedback. The current through R2b is then approximately gate-to-source potential of M1b divided by the resistance of R2b. The current is then mirrored by M3b and M4b (e.g., in a current mirror configuration), and used by M5b to generate voltage $V_{BIG}$ as the output of the $V_{BIG}$ generator module 130.

In one embodiment, R2b is sized to be substantially identical (i.e., to have the same resistance) as R1 of FIG. 2A, and if M5B is sized to be substantially identical (i.e., to have the same W/L) as M3 of FIG. 2A. If M1 is turned completely on (i.e., operating in saturation), it will be appreciated that the current through R1 will be substantially equal to the current through R2b. This effectively forces the voltage drop across R1 to be no more than the threshold voltage of M1.

For example, an exemplary worst-case scenario for the operation of the gain stage module 120 of FIG. 2A occurs when the positive input voltage terminal 104a is tied to $V_{DD}$ and the negative input voltage terminal 104b is tied to GND, causing M2 to turn off and all the current sourced by M3 to flow through M1. Operation of the $V_{BIG}$ generator module 130 of FIG. 2B causes the voltage drop across R2b to create a current through M5b which (because the components are sized to match), causes substantially the same current through M5b to flow through M3 and the same voltage drop across R2b to appear across R1 (i.e., because there is substantially no current loss though M1 operating in saturation). Thus, even in this worst-case scenario, the voltage drop across R1 may provide a sufficient drain-to-gate potential at M1 to keep M1 in saturation.

Each gain stage module 120 may add a certain amount of gain to a voltage signal. In some embodiments, a number of gain stage modules 120 are cascaded to add a desired amount of gain to an input voltage signal (e.g., as shown in FIG. 1), each of the gain stage modules 120 being driven by the same $V_{BIG}$ generated by the $V_{BIG}$ generator module 130. For example, if each gain stage provides a gain of 2, cascading 3 gain stage modules 120 may provide a gain of approximately 8.

In some embodiments of high-speed comparators (e.g., like the high-speed comparator 100 of FIG. 1), the output from the one or more gain stage modules 120 is received at a level shifter module 150. In some embodiments, the level shifter module 150 is a standard level shifter module 150 as known in the art. In other embodiments, the level shifter module 150 is adapted to be driven by a level bias voltage $V_{BIL}$ generated by a $V_{BIL}$ generator module 160. FIGS. 3A and 3D show schematic diagrams of an embodiment of a level shifter module 150 and a $V_{BIL}$ generator module 160, respectively, according to various embodiments of the invention.

The $V_{BIL}$ generator module 160 of FIG. 3B includes an active device M6b and a load R3b. In some embodiments, active device M6b is an N-channel diode-connected MOS device and load R3b is a resistor. It can be shown that the output of the $V_{BIL}$ generator module 160, level bias voltage $V_{BIL}$, is essentially the gate potential of M6b to sink the current through R3b (i.e., $(V_{DD}-V_{GS(M6b)})/R3b$ is substantially equal to $I_{R3b}$).

In some embodiments of the level shifter module 150 of FIG. 3A, R3 and R4 are sized substantially to match R3b, and M5 and M7 are sized substantially to match M6b. It is worth noting that certain components may be added or changed, or component values may be adjusted, to account for certain characteristics of the circuit. For example, R3 and R4 may be sized slightly smaller than R3b to keep M5 and M7 operating in saturation. Similarly, operation of the gain stage modules 120 of FIG. 2A may cause the gate voltages of M4 and/or M6 to see a voltage level substantially equal to $V_{DD}$ less the threshold voltage of an N-channel device. As such, an N-channel device may be added to the $V_{DD}$ generator module 160 in series with R3b, or R3 and/or R4 may be sized differently, to accommodate for the extra threshold-voltage-worth of voltage drop.

It will now be appreciated that the $V_{R3b}$ is substantially equal to $V_{R3}$ (and $V_{R4}$), thereby providing level shift voltages that essentially track $V_{DD}$ (i.e., less the threshold voltage of M6b). These level shift voltages may then be used as outputs of the level shifter module 150. In the embodiment shown, the level shifter module 150 generates a positive level shift output voltage $V_{OUTP}$ and a negative level shift output voltage $V_{OUTN}$. These level shift output voltages may then be used by a comparator output stage (e.g., like the output stage 170 of FIG. 1).

FIG. 4 shows a schematic diagram of an embodiment of an output amplifier module 180 (e.g., like the output amplifier module 180 of FIG. 1) for generating a large-signal output voltage for a high-speed comparator, according to various embodiments of the invention. In some embodiments, the output amplifier module 180 includes a standard CMOS output stage circuit arrangement as known in the art. In other embodiments, the output amplifier module 180 includes an output amplifier circuit arrangement adapted to be driven by a bias voltage, like the level bias voltage $V_{BIL}$ generated by the $V_{BIL}$ generator module 160 of FIG. 3B.

In some embodiments, a positive level shift voltage $V_{INP}$ generated by a level shifter module (like the positive level shift output voltage $V_{OUTP}$ generated by the level shifter module 150 of FIG. 3A) is used to drive a differential pair of P-channel devices M14 and M15; and a negative level shift output voltage $V_{INN}$ generated by a level shifter module (like the negative level shift output voltage $V_{OUTN}$ generated by the level shifter module 150 of FIG. 3A) is used to drive a differential pair of N-channel devices M8 and M9. The differential pair of P-channel devices M14 and M15 is then used to drive a pair of N-channel devices M17 and M19, while the differential pair of N-channel devices M8 and M9 is used to drive a pair of P-channel devices M16 and M18.

It is worth noting that the drive for M16 and M18 is available from the voltage drop across R6 and R5, respectively; and the drive for M17 and M19 is available from the voltage drop across P9 and P5, respectively. In other embodiments, the resistor networks that include R5, R6, R8, and R9 are implemented using transistor-based current sources or current mirrors. However, as discussed above, the use of transistor-based current sources or current mirrors may add capacitance to the circuit, which may in turn add delay. By driving the output amplifier module 180 with an appropriate bias voltage (e.g., the level bias voltage $V_{BIL}$ generated by the $V_{BIL}$ generator module 160 of FIG. 3B), the networks may be implemented with resistors, as shown in FIG. 4.

It will now be appreciated that the output signal generated by the output amplifier module 180 may be a large-signal voltage. For example, the output may be a signal for switching standard CMOS devices. By using the various systems and devices shown in FIGS. 1-4, a small-signal input voltage (e.g., an analog voltage) may be amplified and converted into a large-signal output voltage (e.g., a digital switching signal). Some methods that may be implemented according to embodiments of the invention are described in FIGS. 5 and 7.

Figure 5:
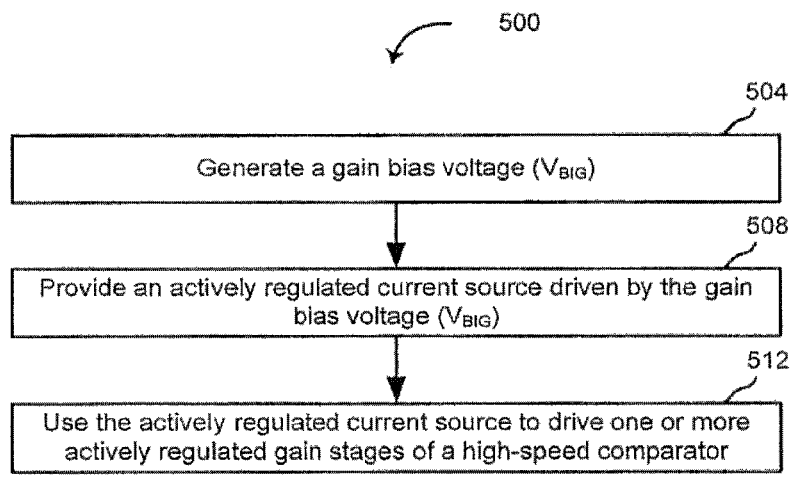
FIG. 5 shows a simplified flow diagram of exemplary methods for providing high-speed gain stage functionality to an input voltage signal, according to various embodiments of the invention.

FIG. 5 shows a simplified flow diagram of exemplary methods for providing high-speed gain stage functionality to an input voltage signal, according to various embodiments of the invention. The method 500 begins at block 504 by generating a gain bias voltage (e.g., $V_{BIG}$). In block 508, the gain bias voltage is used to drive a current source (e.g., tail current source M3 of FIG. 2A), so as to essentially provide an actively regulated current source. The actively regulated current source may then be used in block 512 to drive one or more actively regulated gain stages (e.g., gain stage modules 120 of FIG. 1 or 2A) of a high-speed comparator.

Figure 6:
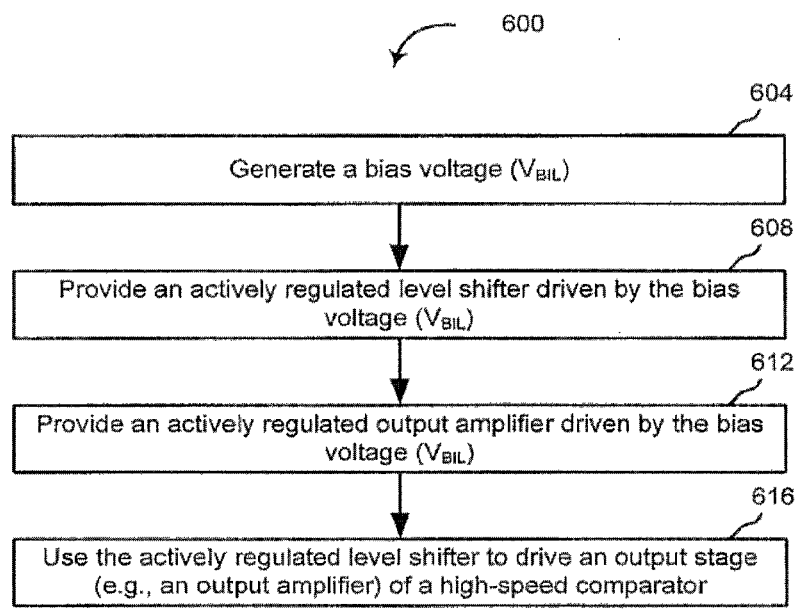
FIG. 6 shows a simplified flow diagram of exemplary methods for providing high-speed decision stage and/or output stage functionality, according to various embodiments of the invention.

FIG. 6 shows a simplified flow diagram of exemplary methods for providing high-speed decision stage and/or output stage functionality, according to various embodiments of the invention. The method 600 begins at block 604 by generating a bias voltage (e.g., $V_{BIL}$). In block 608, the gain bias voltage is used to drive a level shifter (e.g., level shifter module 150 of FIG. 1 or FIG. 3A), so as to essentially provide an actively regulated level shifter. The actively regulated level shifter may then be used in block 616 to drive an output amplifier (e.g., output amplifier module 180 of FIG. 1 or 4) of a high-speed comparator. In some embodiments, the same or a different bias voltage (e.g., $V_{BIL}$) is used in block 612 to drive the output amplifier, which is further driven by the actively regulated level shifter in block 616.

Figure 7:
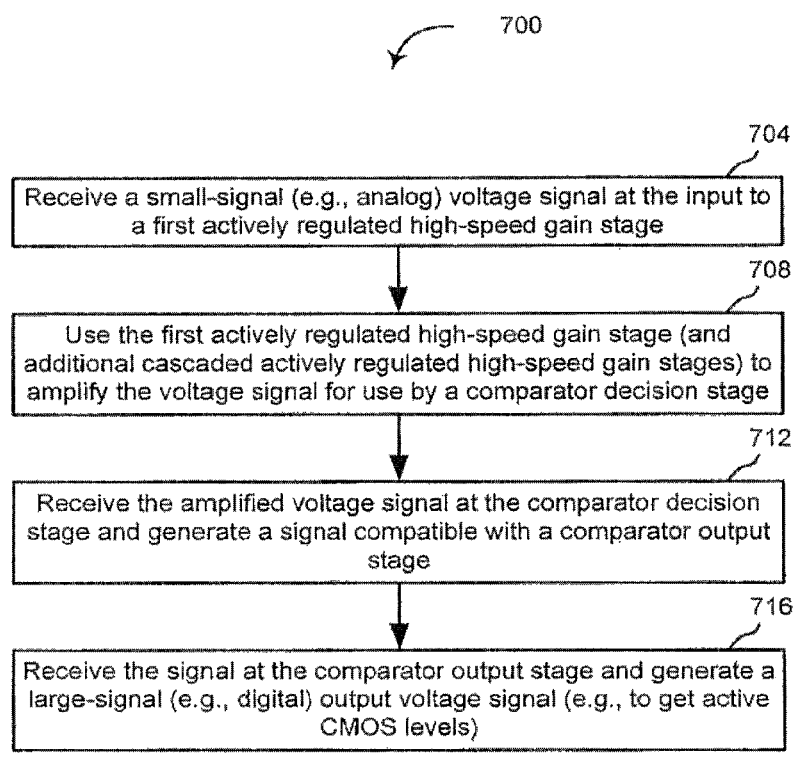
FIG. 7 shows a simplified flow diagram of exemplary methods for providing high-speed comparator functionality, according to various embodiments of the invention.

FIG. 7 shows a simplified flow diagram of exemplary methods for providing high-speed comparator functionality, according to various embodiments of the invention. The method 700 begins at block 704 by receiving a small-signal (e.g., analog) voltage signal at the input to a first actively regulated high-speed gain stage (e.g., the first gain stage module 120a of FIG. 1). In block 708, the first actively regulated high-speed gain stage is used to amplify the voltage signal for use by a comparator decision stage. In some embodiments, additional actively regulated high-speed gain stages are cascaded to provide additional gain. Further, in some embodiments, the amplification at block 708 is implemented substantially according to the steps of method 500 of FIG. 5.

In block 712, the amplified voltage signal is received at a comparator decision stage and used to generate a signal compatible with a comparator output stage. In some embodiments, the signal is level shifted. The signal may then be received at the comparator output stage in block 716 and used to generate a large-signal (e.g., digital) output voltage signal (e.g., to get active CMOS levels). In some embodiments, the decision stage functionality of block 712 and/or the output stage functionality of block 716 are implemented substantially according to the steps of method 600 of FIG. 6.

It should be noted that the methods, systems, and devices discussed above are intended merely to be examples. For example, embodiments described with reference to small-signal and/or large-signal functionality, analog or digital signals, etc. are intended only as examples. Further, specific circuit elements are shown and/or described in some embodiments merely for clarity of description, and are not intended to be limiting.

It must be stressed that various embodiments may omit, substitute, or add various procedures or components as appropriate. For instance, it should be appreciated that, in alternative embodiments, the methods may be performed in an order different from that described, and that various steps may be added, omitted, or combined. Also, features described with respect to certain embodiments may be combined in various other embodiments. Different aspects and elements of the embodiments may be combined in a similar manner. Also, it should be emphasized that technology evolves and, thus, many of the elements are examples and should not be interpreted to limit the scope of the invention.

It should also be appreciated that the following systems, methods, and software may individually or collectively be components of a larger system, wherein other procedures may take precedence over or otherwise modify their application. Also, a number of steps may be required before, after, or concurrently with the following embodiments.

Specific details are given in the description to provide a thorough understanding of the embodiments. However, it will be understood by one of ordinary skill in the art that the embodiments may be practiced without these specific details. For example, well-known circuits, processes, algorithms, structures, waveforms, and techniques have been shown without unnecessary detail in order to avoid obscuring the embodiments.

Further, it may be assumed at various points throughout the description that all components are ideal (e.g., they create no delays and are lossless) to simplify the description of the key ideas of the invention. Those of skill in the art will appreciate that non-idealities may be handled through known engineering and design skills. It will be further understood by those of skill in the art that the embodiments may be practiced with substantial equivalents or other configurations. For example, circuits described with reference to N-channel transistors may also be implemented with P-channel devices, or certain elements shown as resistors may be implemented by another device that provides similar functionality (e.g., an MOS device operating in its linear region), using modifications that are well known to those of skill in the art.

Also, it is noted that the embodiments may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Accordingly, the above description should not be taken as limiting the scope of the invention, as described in the following claims:

What is claimed is:

1. A high-speed comparator, comprising:
an input stage having a gain bias voltage generator and a gain stage module, the gain stage module being driven by a gain bias voltage generated by the gain bias voltage generator, wherein the input stage is configured to receive an input voltage signal and amplify the input voltage signal to generate an amplified voltage signal;
a decision stage, coupled with the input stage and configured to receive the amplified voltage signal and level shift the amplified voltage signal to generate a level-shifted voltage signal; and
an output stage, coupled with the decision stage and configured to receive the level-shifted voltage signal and amplify the level-shifted voltage signal to generate an output voltage signal.

2. The high-speed comparator of claim 1, wherein the input voltage signal is a small signal voltage.

3. The high-speed comparator of claim 1, wherein the input stage comprises a plurality of cascaded gain stage modules.

4. The high-speed comparator of claim 1, wherein the decision stage comprises a level shifter module.

5. The high-speed comparator of claim 1, wherein the output stage comprises an output amplifier, and the output voltage signal is an active CMOS level output voltage signal.

6. The high-speed comparator of claim 1, further comprising a level bias voltage generator coupled with at least one of the decision stage or the output stage.

7. The high-speed comparator of claim 6, wherein the decision stage and/or the output stage is driven at least partially by a level bias voltage generated by the level bias voltage generator.

8. The high-speed comparator of claim 1, wherein the level-shifted voltage signal comprises a positive level-shifted voltage signal and a negative level-shifted voltage signal.

9. The high-speed comparator of claim 1, wherein the gain bias voltage generator is configured to actively regulate a current source in the gain stage module by driving the current source with the gain bias voltage.

10. The high-speed comparator of claim 1, wherein the decision stage has a level bias voltage generator configured to generate a level bias voltage independent from the gain bias voltage, and to actively regulate a current source in the decision stage by driving the current source with the level bias voltage.

11. A method for providing high-speed comparator functionality, comprising:
receiving an input voltage signal at a comparator input stage comprising at least one actively regulated high-speed gain stage;
using the at least one actively regulated high-speed gain stage to generate, from the input voltage signal, an amplified voltage signal for use by a comparator decision stage;
receiving the amplified voltage signal at the comparator decision stage;
level shifting the amplified voltage signal to generate a drive signal at the comparator decision stage, the drive signal being configured to drive a comparator output stage
receiving the drive signal at the comparator output stage; and
generating an output voltage signal at the comparator output stage as a function of the drive signal.

12. The method of claim 11, further comprising:
generating a gain bias voltage;
actively regulating a current source by driving the current source with the gain bias voltage; and
driving the at least one actively regulated high-speed gain source with the actively regulated current source.

13. The method of claim 11, further comprising:
generating a level bias voltage;
and using the level bias voltage to drive at least one of the comparator decision stage or the comparator output stage.

14. The method of claim 11, wherein the drive signal comprises a positive level-shifted voltage signal and a negative level-shifted voltage signal.

15. The method of claim 11, further comprising:
generating a level bias;
actively regulating a current source by driving the current source with the level bias voltage; and
driving the comparator decision stage with the actively regulated current source.

16. A method for providing comparator functionality, comprising:
receiving an input voltage signal in a first stage of a comparator;
generating a bias voltage in the first stage;
amplifying the input voltage signal to produce an amplified voltage signal by actively regulating the first stage with the bias voltage;
level shifting, in a second stage of the comparator, the amplified voltage signal to produce a level-shifted voltage signal; and
amplifying, in a third stage of the comparator, the level-shifted voltage signal to produce an output voltage signal.

17. The method of claim 16, wherein the level-shifted voltage signal comprises a positive level-shifted voltage signal and a negative level-shifted voltage signal.

18. The method of claim 16, wherein actively regulating the first stage with the bias voltage comprises:
actively regulating one or more current sources in the first stage by driving the one or more current sources with the bias voltage.

19. The method of claim 16, wherein the bias voltage is a first bias voltage, the method comprising:
generating a second bias voltage independent from the first bias voltage;
actively regulating a current source by driving the current source with the second bias voltage; and
driving the second stage with the actively regulated current source.

* * * * *